United States Patent [19]

Shinjo

[11] Patent Number: 5,394,337
[45] Date of Patent: Feb. 28, 1995

[54] METHOD FOR WIRE ROUTING OF A SEMICONDUCTOR INTEGRATED CIRCUIT AND APPARATUS FOR IMPLEMENTING THE SAME

[75] Inventor: Keisuke Shinjo, Tokyo, Japan

[73] Assignee: NEC Corporation, Tokyo, Japan

[21] Appl. No.: 967,671

[22] Filed: Oct. 23, 1992

[30] Foreign Application Priority Data

Oct. 25, 1991 [JP]  Japan .................. 3-305687

[51] Int. Cl.6 ................ G06F 15/60; H01L 21/80
[52] U.S. Cl. .................... 364/490; 364/491; 437/51
[58] Field of Search ............ 364/488, 489, 490, 491, 364/578; 395/919, 920, 921; 361/373, 410; 257/499, 209; 437/51

[56] References Cited

U.S. PATENT DOCUMENTS

| | | | |
|---|---|---|---|
| 4,791,609 | 12/1988 | Ito ................................ | 365/63 |
| 4,823,276 | 4/1989 | Hiwatashi ....................... | 364/491 |
| 4,910,680 | 3/1990 | Hiwatashi ....................... | 364/491 |
| 4,979,018 | 12/1990 | Tanaka .......................... | 357/71 |
| 5,062,054 | 10/1991 | Kawakami et al. ............... | 364/491 |
| 5,121,336 | 6/1992 | Chang ........................... | 364/491 |
| 5,124,273 | 6/1992 | Minami .......................... | 437/51 |
| 5,196,362 | 3/1993 | Suzuki .......................... | 437/51 |
| 5,229,629 | 7/1993 | Koike ........................... | 257/211 |

OTHER PUBLICATIONS

Hong, Se June, et al. "Wire Routing Machines-New Tools for VLSI Physical Design" Proc. IEEE, vol. 71, pp. 57–65, Jan. 1983.

*Primary Examiner*—Kevin J. Teska
*Assistant Examiner*—Nguyen Tan

[57] ABSTRACT

A method and apparatus for wire routing of a semiconductor integrated circuit wherein the interconnection between the functional blocks disposed on a chip of the semiconductor integrated circuit having four or more wiring layers is implemented by computers. A plurality of adjacent wiring layers form a single set, and for at least two sets, the wire routing between terminals of the functional blocks lying on the wiring layers formed by the sets is carried out for each set independently from the other set. A plurality of computers are used, which communicate with each other through their network. A file system of one computer is shared between the two computers so that the wire routing process program, input information on the wire routing and a wire routing result can be stored within the shared file system, whereby an efficient concurrent processing is possible and the processing speed can be improved while the number of wiring layers dealt with by each wire routing process are reduced.

7 Claims, 9 Drawing Sheets

Fig. 5A
4AL
3AL
2AL
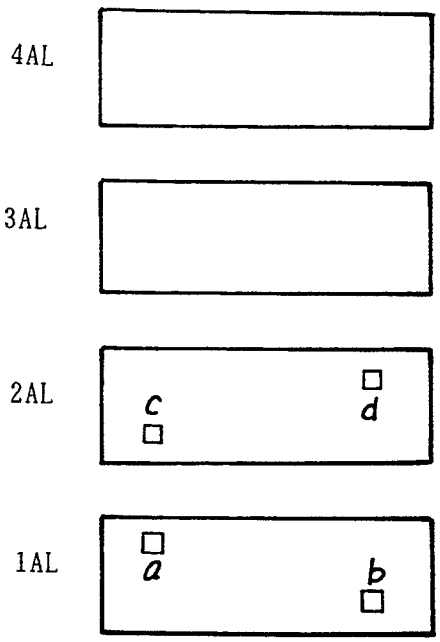
1AL
Fig. 5C
4AL
3AL
2AL
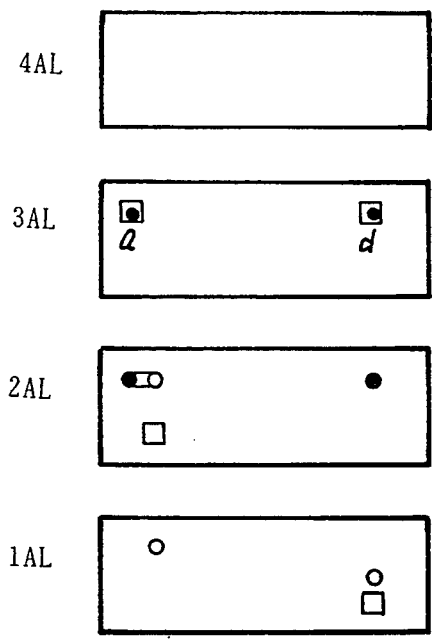
1AL
Fig. 5B
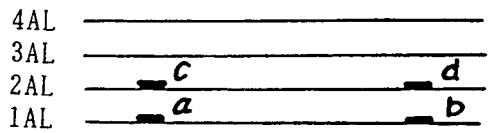
Fig. 5D
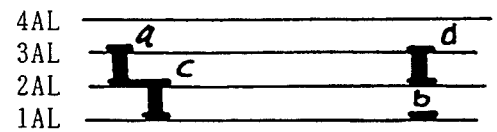
Fig. 5E
☐ --- TERMINAL
○ --- 1AL-2AL THROUGH HOLE
● --- 3AL-4AL THROUGH HOLE

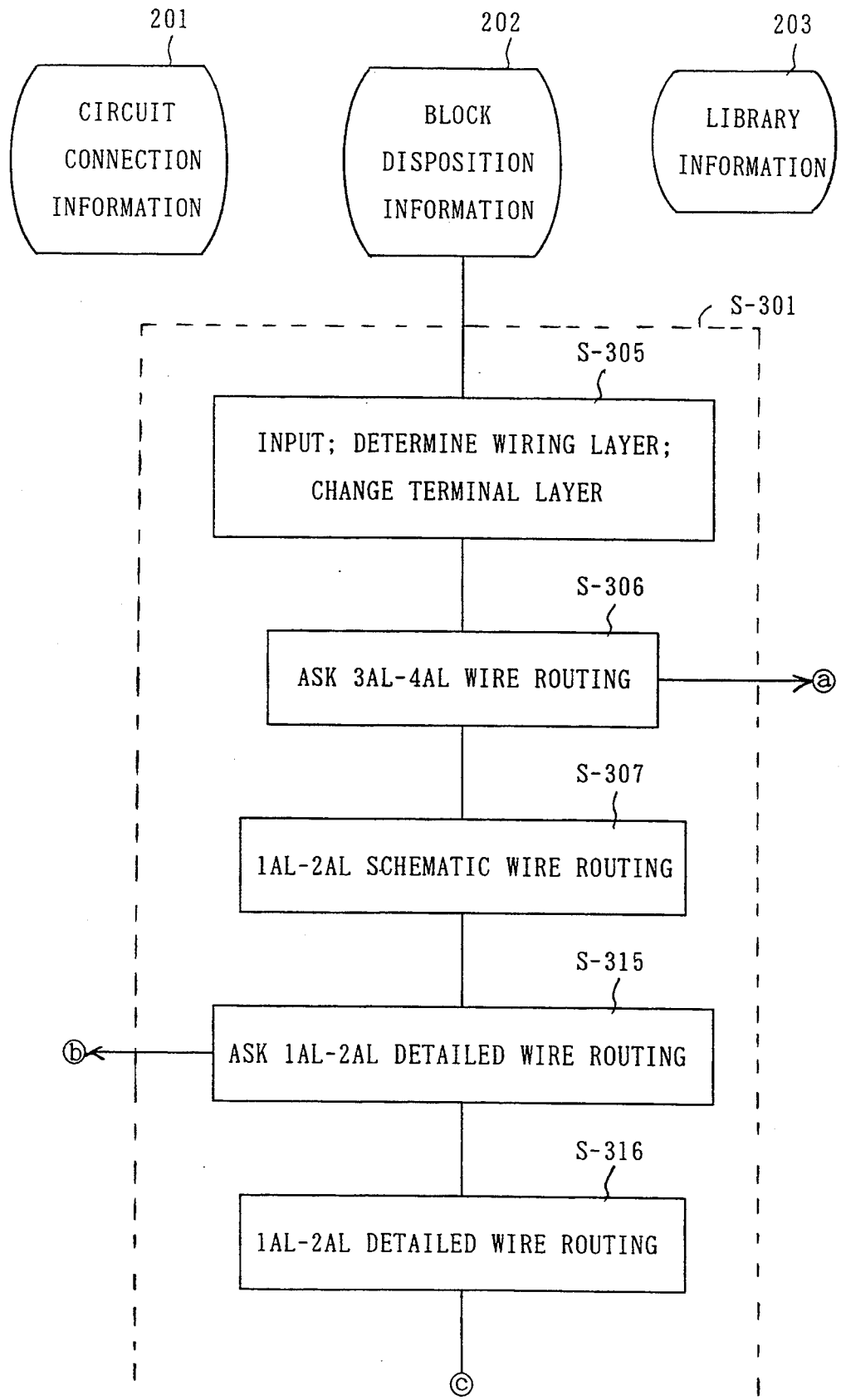

METHOD FOR WIRE ROUTING OF A SEMICONDUCTOR INTEGRATED CIRCUIT AND APPARATUS FOR IMPLEMENTING THE SAME

FIELD OF THE INVENTION

The present invention relates to a method of wire routing of a semiconductor integrated circuit and an apparatus for implementing the same and, in particular, to a method and an apparatus for carrying out the wire routing of the same circuit concurrently.

BACKGROUND OF THE INVENTION

As a method for automatic wire routing of a semiconductor integrated circuit, various ones such as a labyrinth search method or a line search method have been reported (e.g. PROCEEDINGS OF THE IEEE, VOL. 71, NO. 1, PP. 328–336, JANUARY 1983). However, as the semiconductor integrated circuit has recently been made large-scale, its wiring area has also been increased or been made of multiple layers and, therefore, to process the entire wiring area of the semiconductor integrated circuit in block according to the foregoing methods has caused the increase of the processing time or of the used memories of the computer making it gradually difficult.

Conventionally, in order to solve this type of problem, the wiring area available on the semiconductor integrated circuit has been divided into a plurality of portions, each of which is processed in block according to the foregoing method. According to this method, as illustrated in FIG. 1 in the form of a flowchart of the conventional system, before the actual wire routing process is carried out, a process S-100 called a schematic wire routing is provided and, after a schematic wiring area is determined based on the library data regarding the wire routing scheme, the aforementioned labyrinth search method or line search method is repeatedly carried out for each divided wiring area according to a process S-102 called a detailed wire routing until the wire routing process of the entire wiring area is completed.

The foregoing process is specifically described with reference to the accompanying drawings. FIG. 2 is a schematic representation of the wiring areas available on a conventional semiconductor integrated circuit, in which each area sectioned in the form of a rectangle indicates a divided wiring area to be processed in block when the detailed wire routing is carried out. As shown, signs A, B, C . . . are each assigned in the direction of column, and signs 1, 2, 3 . . . are each assigned in the direction of row. The divided wiring area corresponding to the intersection of the row and the column is called (A, 1), and the like. If, by way of example, a terminal "a" at the area (A,5) and a terminal "b" at the area (D,2) are interconnected to each other, then, in the schematic wire routing process, it is determined over the entire wiring area which divided area each wire passes through, from which side the wire enters the selected divided wiring area, or from which side it leaves (S-100). With the terminals "a" and "b", it is determined that they are interconnected using, for example, divided wiring areas drawn by oblique lines of FIG. 2, and the wire starting from the terminal "a" passes through the area (A,5) for the right side and enters the area (B,5) from the left side to pass through the right side and enters the area (C,5) from the left side to leave for the upper side. In this determination, it is taken into account to make the wiring density of each divided area as extremely uniform as possible, to make the number of the divided areas each wire passes through as extremely small as possible and to satisfy several preset conditions as much as possible.

Thereafter, in the detailed wire routing process, a wiring scheme down to the boundary side is determined for each divided area. At this time, if the wire routing of the adjacent divided wiring area has already been carried out, then the wire passing through its boundary side is laid so that it is connected to the same wire at the boundary side. On the other hand, if otherwise, then the wire passing through that boundary side is drawn to an arbitrary position on the boundary side so that when the wire routing at the adjacent divided wiring area is carried out it is connected to the same wire at the boundary side (S-102).

In recent years, as typically represented by a computer system called a work station, with the technical progress of the computer suitable for carrying out a concurrent processing under the network environment, or with further increase of the scale of the semiconductor integrated circuit, also in the wire routing process of the semiconductor integrated circuit, a trend has been increased in which the data processing speed is aimed at increasing through the concurrent processing. When the foregoing conventional wire routing process of the semiconductor integrated circuit is adapted to such a concurrent processing, it is considered to use a plurality of computers or calculators and assign the detailed wire routing process for each divided wiring area to each computer or calculator.

However, in the conventional system, when a certain computer or calculator tries to carry out the wire routing at a certain divided area, if the adjacent wiring area is being processed by other computer or calculator, it cannot be determined to which position of a side contacting this adjacent divided wiring area the wire should be drawn. Therefore, until that the wire routing at the adjacent divided wiring areas being processed have been completed, the preceding computer or calculator will have to wait for its own processing.

As described above, in the conventional concurrent wire routing process of the semiconductor integrated circuit, one computer or calculator cannot often help waiting for the completion of the processing by other computer or calculator with the result that it cannot effectively be utilized thus causing the overall processing speed not to be improved.

SUMMARY OF THE INVENTION

The present invention was made in view of the foregoing circumstances, and its object is to provide a wire routing process of the semiconductor integrated circuit which allows the concurrent wire routing process to be achieved so that the computer or calculator may effectively be used. A further object of the present invention is to provide an apparatus for implementing such a processing method.

According to the present invention, in order to achieve the foregoing ends, there is provided a method for wire routing of a semiconductor integrated circuit in which the interconnection between the functional blocks disposed on a chip of a semiconductor integrated circuit having four or more wiring layers is designed by means of the computer, taking a plurality of adjacent wiring layers as a single set, for at least two sets, the wire routing between terminals of the blocks lying on the wiring layers included by those sets are carried out for each set independently of the other.

One mode of the present invention comprises a first wire routing process between the terminal of a block lying on a first wiring layer and the terminal of a block lying on a second wiring layer adjacent to the first wiring layer and a second wire routing process between the terminal of a block lying on a third wiring layer and the terminal of a block lying on a fourth wiring layer adjacent to the third wiring layer.

In the present invention, a plurality of computers are used, which can communicate with each other through the network, and at least one of the file systems possessed by at least one of the computers is shared with at least two of the computers so that the wire routing process program of the semiconductor integrated circuit, input information of the wire routing process and the wire routing result can be stored therein. Here, the wire routing process for each set can be concurrently executed by independent computers.

Further, in the present invention, a computer comprising a plurality of arithmetic operation units may be used to concurrently carry out the wire routing process for each set by means of the independent arithmetic operation units.

In addition, according to the present invention, in order to achieve the foregoing ends, there is provided an apparatus for wire routing of the semiconductor integrated circuit in which the interconnection between the functional blocks disposed on a chip of a semiconductor integrated circuit comprising four or more wiring layers is designed, the apparatus comprising at least two arithmetic operation means, specifically for at least two of the arithmetic operation means, each arithmetic operation means carrying out the wire routing between the terminals of the blocks lying on one set of plural adjacent wiring layers independently of the other.

In the present invention, at least one of the file systems possessed by at least one of the plurality of arithmetic operation means may be shared between at least two of the arithmetic operation means so that the wire routing process program of the semiconductor integrated circuit, input information regarding the wire routing process and the wire routing result can be stored therein.

In the foregoing invention, since taking the plurality of adjacent wiring layers as a single set, a plurality of sets of wiring layers are formed so that the wire routing process can independently be executed for each set, an efficient concurrent processing can be achieved and the processing speed can be improved while it becomes possible to reduce the number of wiring layers dealt with by each wire routing process and the entire processing can be simplified.

BRIEF DESCRIPTION OF THE DRAWINGS

FIGS. 4-1 and 4-2 are the two parts of a flowchart of a first embodiment of the method according to the present invention;

FIGS. 5A through BE are respectively an explanatory view of the processing according to the first embodiment of the present invention; and FIGS. 6-1, 6-2 and 6-3 are the three parts of a flowchart of a second embodiment of the method according to the present invention.

DETAILED DESCRIPTION OF THE PREFERRED EMBODIMENTS

Several embodiments of the present invention are hereinafter described with reference to the accompanying drawings.

Figure 1:
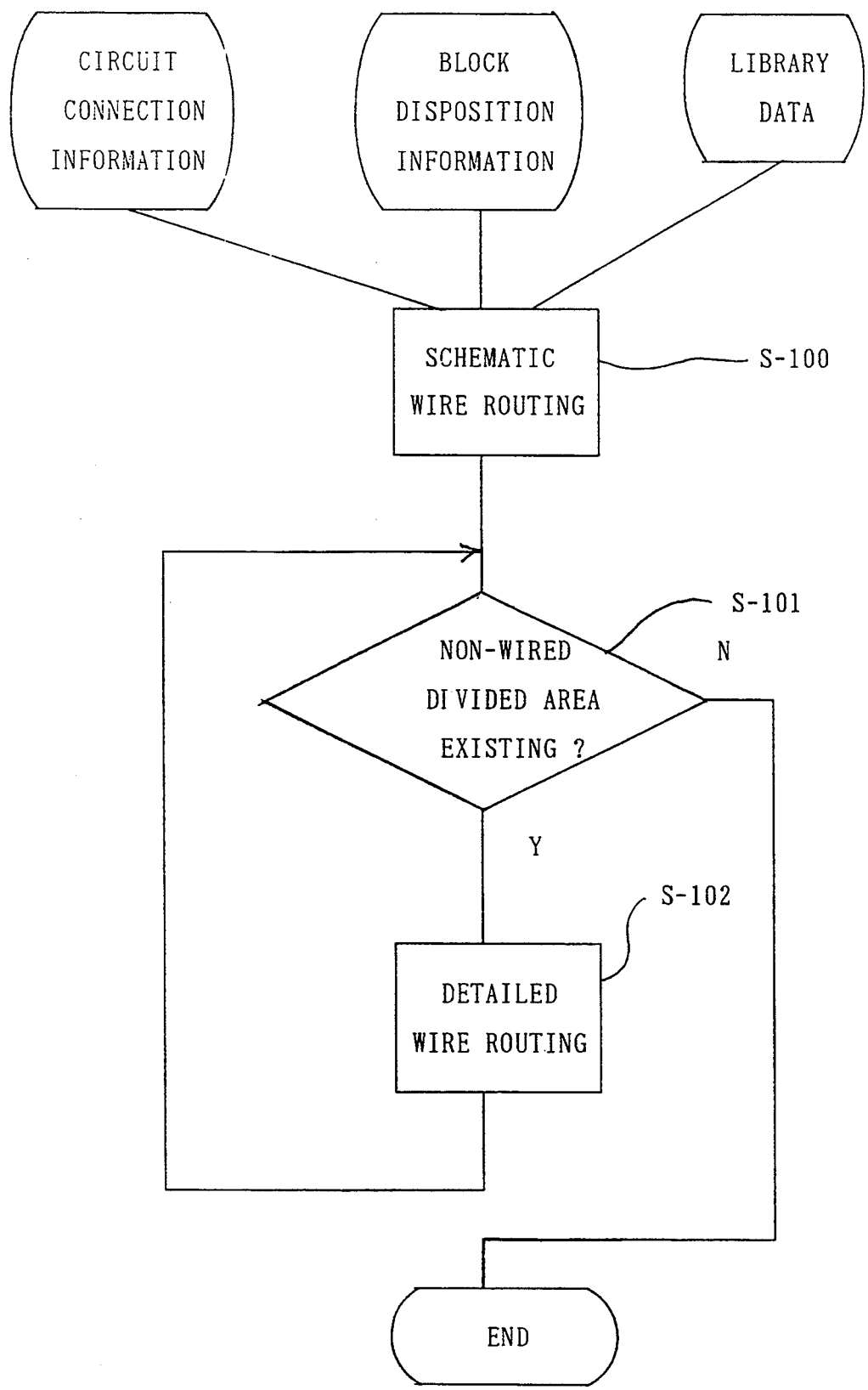
FIG. 1 is a flowchart of a conventional wire routing process of the semiconductor integrated circuit.
Figure 2:
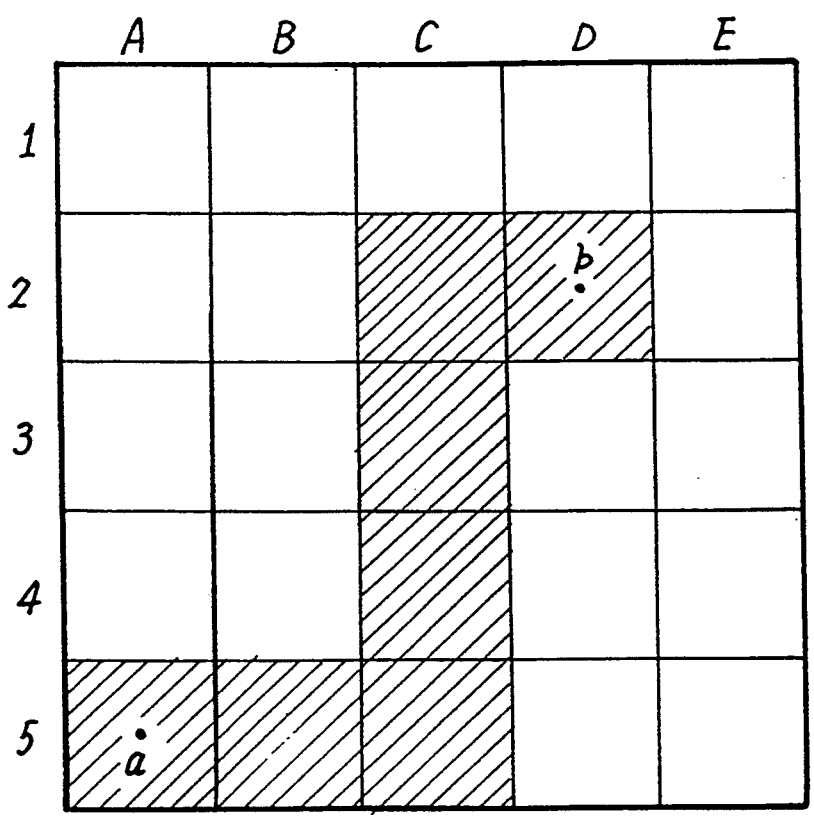
FIG. 2 is an explanatory view of wiring areas of the conventional semiconductor integrated circuit.
Figure 3:
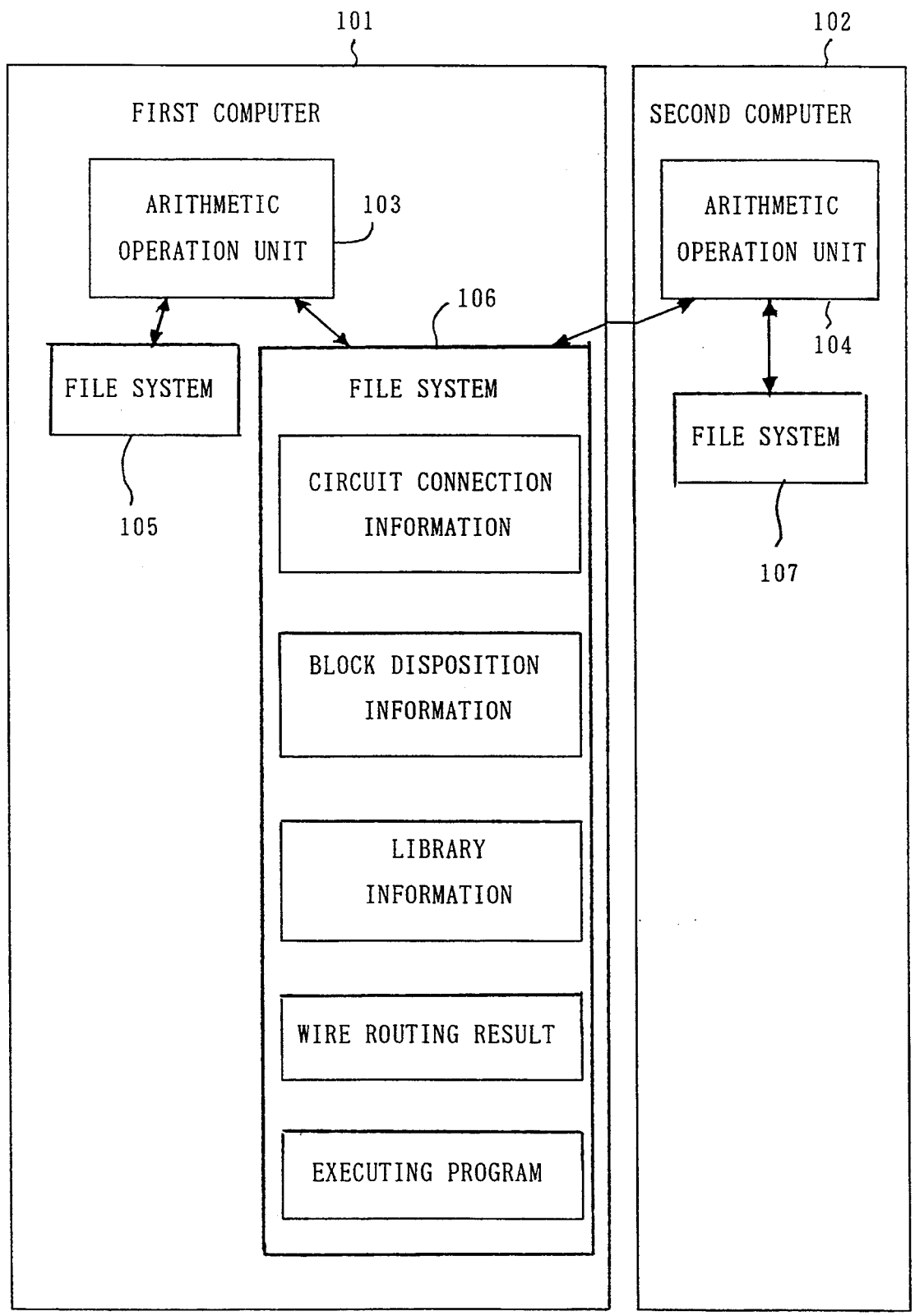
FIG. 3 is a view of the arrangement of a specific embodiment of the apparatus according to the present invention.

FIG. 3 is a view of the arrangement of one embodiment of an apparatus for wire routing of a semiconductor integrated circuit according to the present invention, in which a first computer 101 and a second computer 102 are interconnected via their network, and arithmetic operation units 103 and 104 are respectively intended for the computers 101 and 102. A file system 105 is loaded on the computer 101 to store the working information temporarily generated while the arithmetic operation unit 101 is executing the processing, and no access is made from the arithmetic operation unit 104. A file system 107 is loaded on the computer 102 to store the working information temporarily generated while the arithmetic operation unit 102 is executing the processing, and no access is made from the arithmetic operation unit 101. A file system 106 is loaded on the computer 101 so that it can be accessed from both of the arithmetic operation units 103 and 104. It stores the circuit connection information, block disposition information, various library informations, wire routing result and the executing program for implementing the wire routing method of the present invention shared with both arithmetic operation units, and the data generated during the processing which is necessary to be shared by both arithmetic operation units.

Figures 1, 4:
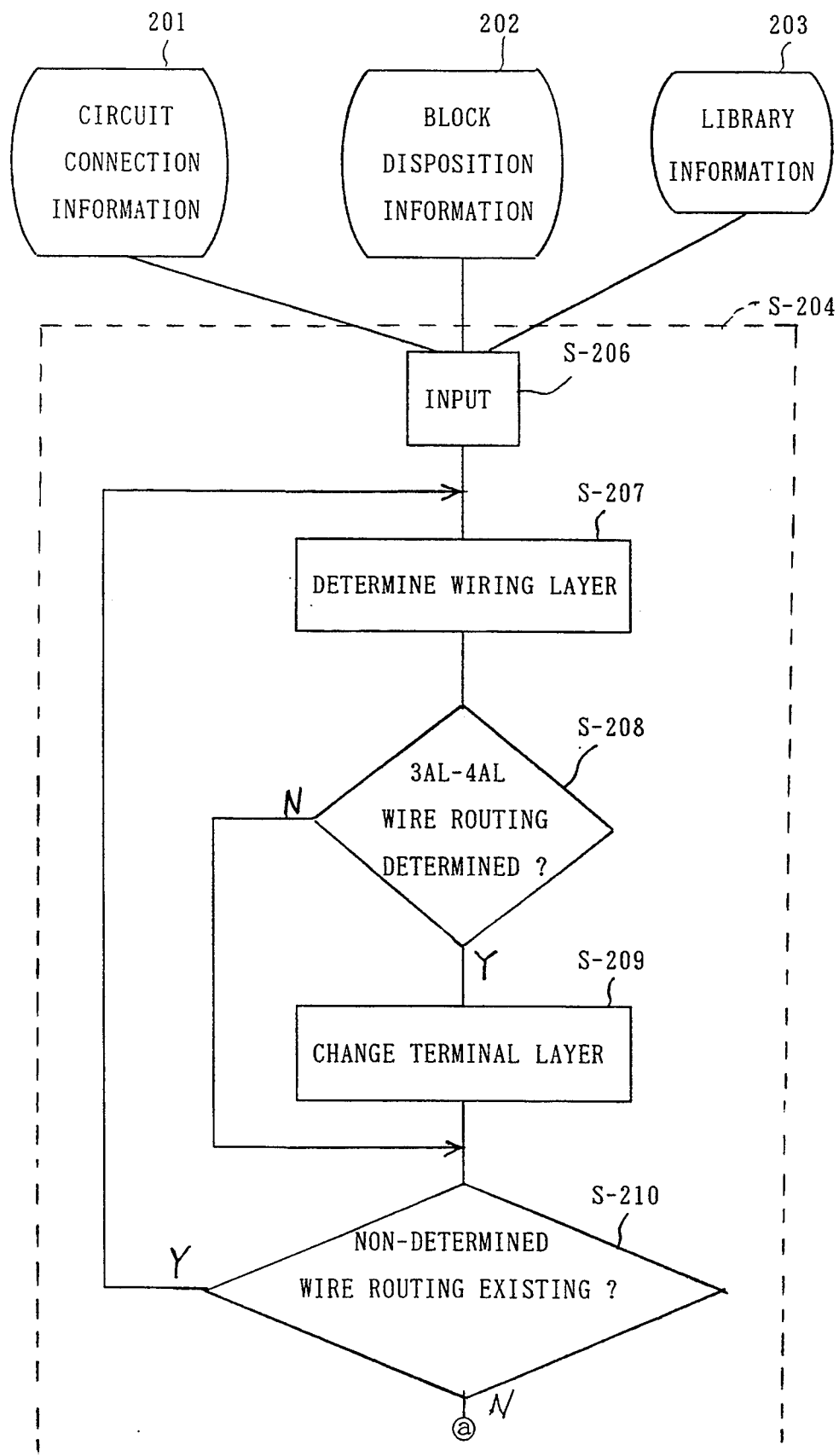
Figures 2, 4:
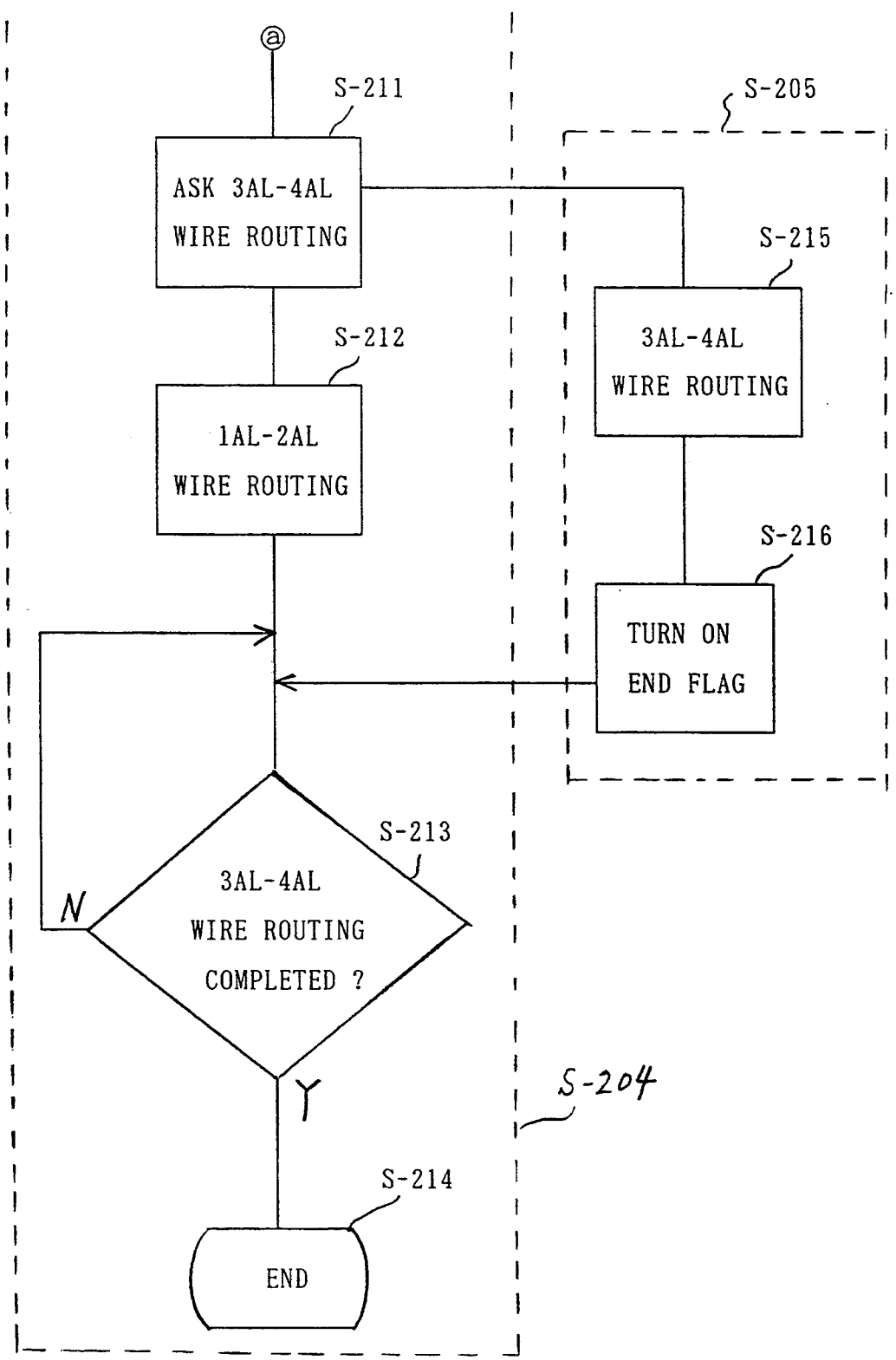

FIG. 4 is a flowchart of a first embodiment of the method for wire routing of the semiconductor integrated circuit according to the present invention. This embodiment is implemented by the apparatus of FIG. 3. The operation of this embodiment is hereinafter described with reference to FIGS. 3 and 4.

Referring to FIG. 4, S-204 represents the processing by the arithmetic operation unit 103, and S-205 the processing by the arithmetic operation unit 104. Further, the input data for this processing system is mainly comprised of three types of information (circuit connection information 201, block disposition information 202 and library information 203). The block disposition information 202 includes the position at which each functional block is disposed on the semiconductor integrated circuit, and this is prepared from the circuit connection information 201 and the library information 203 by a disposition system and the like which have been executed before this processing system is driven. The library information 203 includes the information regarding the shape of each block, position where the wire is forbidden to pass through, terminal position or the wire routing rule of the semiconductor integrated circuit. Incidentally, in this embodiment, the semiconductor integrated circuit comprises four wiring layers; 1AL, 2AL, 3AL and 4AL as designated from below, and the information regarding the block is stored within the block disposition information 202 including, for example, one that each block has its all terminals on 1AL or 2AL.

In this processing system, the process is started by the arithmetic operation unit 103, and the data input is made in S-206. In this process, the foregoing input data is entered to store into the internal table of this processing system. At this time, the data necessary to be referenced also by the arithmetic operation unit 104 is stored within the file system 106 of FIG. 3.

Next, prior to the concurrent wire routing between 1AL and 2AL and 3AL and 4AL, it is determined in S-207 whether each wire routing described within the circuit connection information 201 should be carried out between 1AL and 2AL or 3AL and 4AL. If it is determined to be carried out the wire routing between 3AL and 4AL, then, in S-209, the terminals of the entire block connected to that wire are drawn up to 3AL.

FIGS. 5A through 5E are respectively an explanatory view of this process. These each illustrate the position of the terminal of an arbitrarily chosen block disposed on the semi-conductor integrated circuit, which is retained within the file system 106, which is the area for storing the shared information of FIG. 3. FIGS. 5A and 5B are respectively a plan view and a lateral view prior to the execution of S-204, FIGS. 5C and 5D are respectively a plan view and a lateral view after the execution of S-204, and FIG. 5E reveals the meaning of the pattern emerging within the figure. It reveals that since, by the processing in S-204, it is determined that the wire having the terminal "a" of 1AL and the wire having the terminal "b" of 2AL are interconnected by the wiring between 3AL and 4AL, the terminal has been drawn up to 3AL by using a through hole between 1AL and 2AL, wiring and a through hole between 2AL and 3AL. The through hole generated by this processing is considered as an obstacle as one within other blocks in the wire routing process S-212 between 1AL and 2AL, which will be thereafter executed.

After these processes are repeatedly carried out on the entire wire routing, the arithmetic operation unit 103 asks the arithmetic operation unit 104 to carry out the wire routing between 3AL and 4AL in S-211 while it executes wire routing itself between 1AL and 2AL in S-212. Upon receipt of the request, the arithmetic operation unit 104 starts to carry out the wire routing between 3AL and 4AL in S-215. After the wire routing between 3AL and 4AL has been completed, in order to inform it to the arithmetic operation unit 103, the arithmetic operation unit 104 writes an end flag at a predetermined area of the shared file system in S-216 and ends the process. Upon completion of the wire routing between 1AL and 2AL, the arithmetic operation unit 103 checks in S-213 whether the wire routing between 3AL and 4AL has been completed or not and, if yes, it ends the entire process in S-214. If otherwise, then it waits for the completion of the wiring between 3AL and 4AL to end the entire process.

Figures 2, 6:
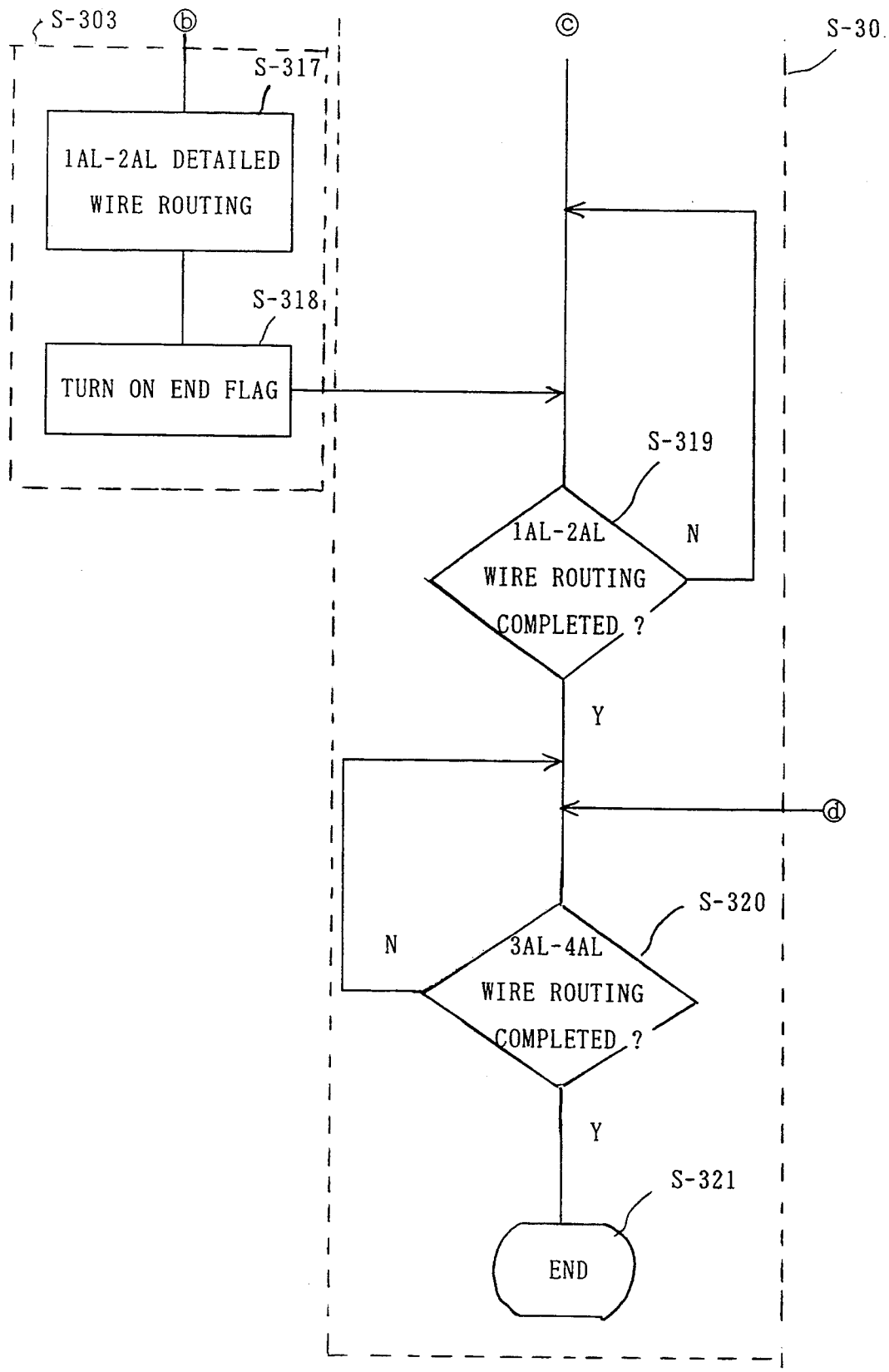
Figures 3, 6:
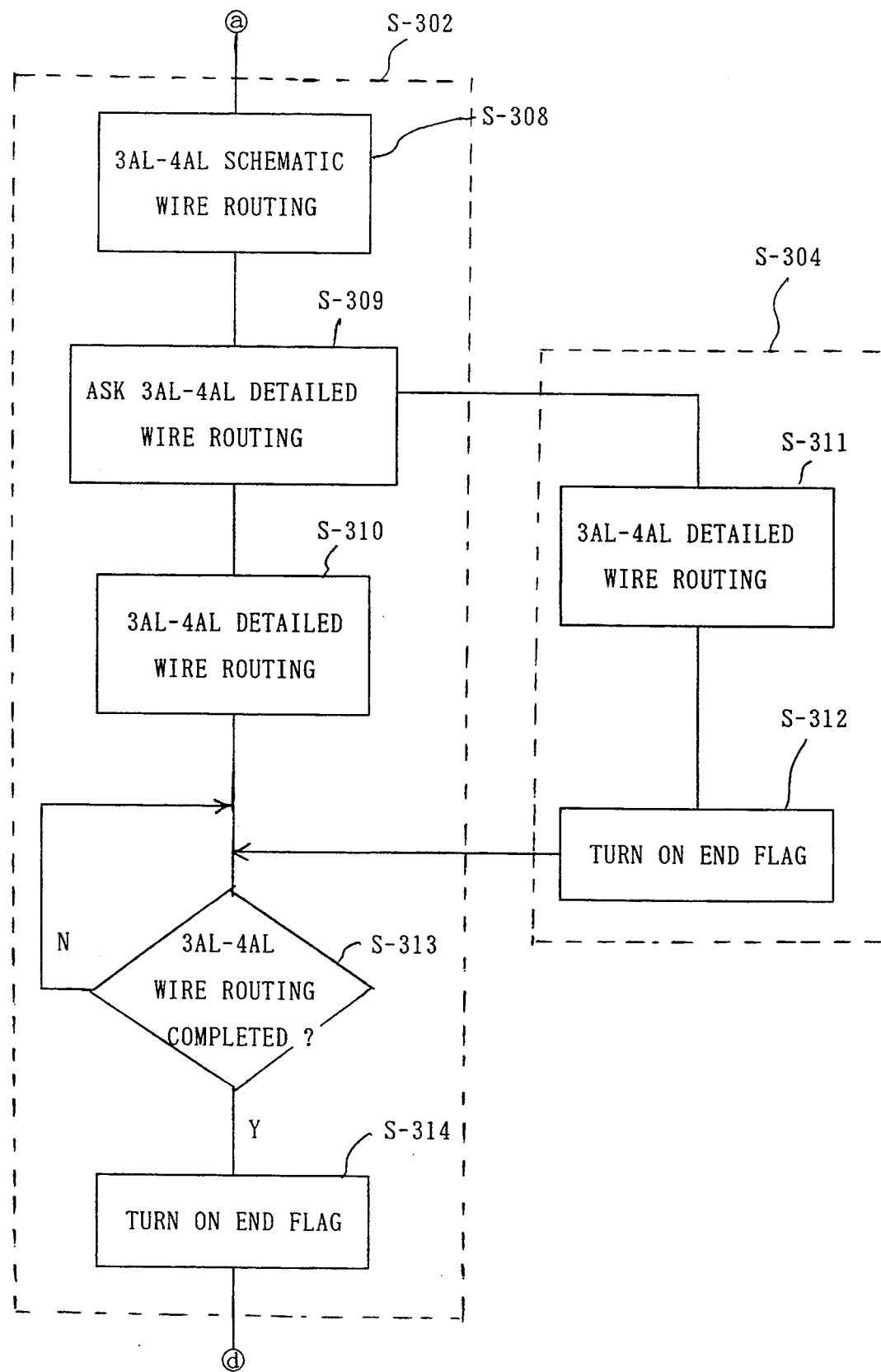

FIG. 6 is a flowchart of a second embodiment of the method according to the present invention.

In this embodiment, four computers are used, and S-301, S-302, S-303 and S-304 are each assigned to the arithmetic operation unit of each computer to achieve the concurrent processing.

In this embodiment, the schematic wire routing process and the detailed wire routing process for each divided area are combined. That is, after the wire routings between 1AL and 2AL and between 3AL and 4AL are determined for each wire, the schematic wire routing and the detailed wire routing are carried out on both of these sets of wiring layers independently of each other.

First, the arithmetic operation unit assigned to S-301 carries out the input process in S-305 and, in S-306, asks the arithmetic operation unit assigned to S-302 to carry out the wire routing between 3AL and 4AL while it continuously executes the schematic wire routing itself between 1AL and 2AL in S-307. On the other hand, the asked arithmetic operation unit assigned to S-302 carries out the schematic wire routing between 3AL and 4AL in S-308 and, in S-309, asks the arithmetic operation unit assigned to S-304 to execute the detailed wire routing between 3AL and 4AL while it continuously concurrently executes the detailed wire routing itself between 3AL and 4AL in S-310. The asked arithmetic operation unit assigned to S-304 concurrently executes the detailed wire routing between 3AL and 4AL in S-311 and, upon completion of the processing, in S-312, it turns the flag on to inform the one assigned to S-302 of the completion of the process. The arithmetic operation unit assigned to S-302, upon completion of its own process, checks in S-313 whether S-304 has been completed or not and, after confirming the completion, then turns on the flag indicating the completion of the wire routing between 3AL and 4AL in S-314 to inform the arithmetic operation unit assigned to S-301 to that effect.

On the other hand, the arithmetic operation unit assigned to S-301 further issues a request to carry out the detailed wire routing between 1At and 2AL to the arithmetic operation unit assigned to S-303 in S-315 while it continuously concurrently caries out the detailed wire routing itself between 1AL and 2AL in S-316. The asked arithmetic operation unit assigned to S-303 concurrently executes the detailed wire routing between 1AL and 2AL in S-317 and, upon completion of the process, turns on the flag in S-318 to inform the arithmetic operation unit assigned to S-301 to that effect. Finally, the arithmetic operation unit assigned to S-301, upon completion of its own detailed wire routing between 1AL and 2AL, checks in S-319 whether the arithmetic operation unit assigned to S-303 has completed its processing or not and after confirming the completion, further checks in S-320 whether the arithmetic operation unit assigned to S-302 has completed its processing or not and after confirming the completion, it ends the processing in S-321.

In this embodiment, although there remains a problem that the processes conflict with each other between two arithmetic operation units each processing the same set, the speedization of the processing can be achieved because the processing of different sets can be completely independently carried out and the concurrent execution of the schematic wire rouing can also be achieved.

The present invention is not necessarily restricted to the foregoing embodiments, but various changes and modifications can be made within the scope and spirit of the appended claims.

What is claimed is:

1. Method for wire routing of a semiconductor integrated circuit having functional blocks disposed on a chip, four or more wiring layers, and terminals of said blocks lying on said wiring layers, the method comprising the steps of:

(a) providing in said integrated circuit a plurality of sets of adjacent wiring layers;

(b) providing at least one computer; and (c) carrying out the wire routing between the terminals of the blocks for a plurality of said sets concurrently by said computer.

2. Method for wire routing of a semiconductor integrated circuit as set forth in claim 1, wherein said carrying out step comprises a first wire routing process for connecting between the terminal of a functional block lying on a first wiring layer and the terminal of a functional block lying on a second wiring layer adjacent to said first wiring layer and a second wire routing process for connecting between the terminal of a functional block lying on a third wiring layer and the terminal of a functional block lying on a fourth wiring layer adjacent to said third wiring layer.

3. Method for wire routing of a semiconductor integrated circuit as set forth in claim 1 wherein a plurality of computers are used and communicate with each other through a network thereof, and at least one file system possessed by at least one of the computers is shared by at least two of the computers so that a wire routing process program of the semiconductor integrated circuit, an input information on the wire routing process and a wire routing result are stored therein.

4. Method for wire routing of a semiconductor integrated circuit as set forth in claim 3 wherein the wire routing process for each set of wiring layers is concurrently carried out by independent computers.

5. Method for wire routing of a semiconductor integrated circuit as set forth in claim 1 wherein said computer comprises a plurality of independent arithmetic operation units to concurrently execute a wire routing process for each set of wiring layers by said arithmetic operation units.

6. Apparatus for wire routing of a semiconductor integrated circuit including functional blocks disposed on a chip of the semiconductor integrated circuit, and four or more wiring layers for interconnection between the functional blocks, said apparatus comprising at least two arithmetic operation units and at least one file system, each arithmetic operation unit carrying out the wire routing between terminals of the functional blocks lying on the wiring layers formed by one set of a plurality of adjacent wiring layers independently of another arithmetic operation unit for another set of a plurality of adjacent wiring layers, said file system storing a wire routing process program of the semiconductor integrated circuit, an input information on the wire routing and a wire routing process result, said file system being connected to said at least two arithmetic operation units.

7. Apparatus for wire routing of a semiconductor integrated circuit in which an interconnection between functional blocks disposed on a chip of the semiconductor integrated circuit is comprised of four or more wiring layers, said apparatus comprising at least two computers, each of said computers including an arithmetic operation unit and at least one file system, said arithmetic operation unit of each computer carrying out a wire routing between terminals of the functional blocks lying on the wiring layers formed by a set of a plurality of adjacent wiring layers independently of the arithmetic operation unit of another computer for another set of a plurality of adjacent wiring layers, said file system of at least one computer storing a wire routing process program of the semiconductor integrated circuit, an input information on the wire routing and a wire routing result and being connected to at least one arithmetic operation unit of another computer.

* * * * *